US007582531B2

(12) United States Patent
Siemieniec et al.

(10) Patent No.: US 7,582,531 B2
(45) Date of Patent: Sep. 1, 2009

(54) METHOD FOR PRODUCING A BURIED SEMICONDUCTOR LAYER

(75) Inventors: Ralf Siemieniec, Villach (AT); Hans-Joachim Schulze, Ottobrunn (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 176 days.

(21) Appl. No.: 11/364,882

(22) Filed: Feb. 28, 2006

(65) Prior Publication Data

US 2006/0211189 A1 Sep. 21, 2006

(30) Foreign Application Priority Data

Feb. 28, 2005 (DE) .................. 10 2005 009 020

(51) Int. Cl.
  *H01L 21/336* (2006.01)
(52) U.S. Cl. .................. 438/268; 438/270; 438/528; 438/530; 257/E21.11; 257/E21.418
(58) Field of Classification Search ................. 438/194, 438/206, 520, 521, 529; 257/E21.11, E21.147, 257/E21.315
  See application file for complete search history.

(56) References Cited

U.S. PATENT DOCUMENTS

| 4,941,026 | A | 7/1990 | Temple |
| 4,987,087 | A | 1/1991 | Voss |
| 6,008,520 | A | 12/1999 | Darwish et al. |
| 6,190,970 | B1 | 2/2001 | Liao et al. |
| 2003/0155610 | A1 | 8/2003 | Schlogl et al. |
| 2004/0041225 | A1 | 3/2004 | Nemoto |
| 2005/0133857 | A1 | 6/2005 | Mauder et al. |

FOREIGN PATENT DOCUMENTS

DE 10360574 7/2005

OTHER PUBLICATIONS

H.-J. Schulze, F.-J. Niedernostheide, M. Schmitt, U. Kellner-Werdehausen, G. Wachutka, Electrochemical Society Proceedings vol. 2002-20, High Purity VII, ed. by C. L. Claeys, M. Watanabe, P. Rai-Choudhury, and P. Stallhofer, pp. 320-335 (16 Pages).

*Primary Examiner*—Alexander G Ghyka
*Assistant Examiner*—Cheung Lee
(74) *Attorney, Agent, or Firm*—Maginot, Moore & Beck

(57) ABSTRACT

A method for producing a region of increased doping in an n-doped semiconductor layer which is buried in a semiconductor body of a vertical power transistor and which is arranged between a p-doped body region facing the front side contact of the power transistor and an n-doped substrate facing the rear side contact of the power transistor has the following steps: a) irradiation of at least one part of the surface of the semiconductor body with protons, and b) heat treatment of the semiconductor body.

13 Claims, 5 Drawing Sheets

METHOD FOR PRODUCING A BURIED SEMICONDUCTOR LAYER

FIELD OF THE INVENTION

The invention relates to a method for producing a region of increased doping in an n-doped semiconductor layer which is buried in a semiconductor body.

BACKGROUND

Semiconductor components often have complicated three-dimensional structures, the fabrication of which requires complex process sequences. Doped semiconductor regions or semiconductor layers which are situated within the semiconductor body of the semiconductor component ("buried" semiconductor regions or semiconductor layers) are usually produced by progressively depositing a plurality of semiconductor layers on a substrate, the buried semiconductor layer generally being one of the deposited semiconductor layers and being covered by the subsequently deposited semiconductor layers. Epitaxy methods are often used for producing such semiconductor layers. However, epitaxy methods involve a relatively high outlay as viewed both from a technical standpoint and from an economic standpoint, particularly when they are combined with a process for setting the charge carrier lifetime within the semiconductor body or the doping intensity is intended to vary locally within the epitaxial layer.

SUMMARY

The object on which the invention is based is to specify a method for producing an n-doped semiconductor layer buried in a semiconductor body of a semiconductor component by means of which the above-described disadvantages of previous fabrication methods can be avoided.

The method according to at least some embodiments of the invention for producing a region of increased doping in an n-doped semiconductor layer which is buried above an n-doped subtrate in a semiconductor body of a power transistor and is arranged between a p-doped region (which is e.g. a body region or base region) formed in the semiconductor body and the n-doped substrate of the power transistor has the following steps:

a) irradiation of at least one part of the surface of the semiconductor body with protons; and b) heat treatment of the semiconductor body.

The method according to the invention may be used particularly advantageously in the fabrication of vertical power transistors (in particular vertical field plate trench transistors). In this case, the n-doped semiconductor layer is arranged between a p-doped region facing the front side contact of the power transistor and an n-doped substrate facing the rear side contact of the power transistor, in which case the n-doped substrate may serve as a drain region. As an alternative, a highly n-doped semiconductor layer which functions as a drain region in the form of a "buried layer" may be arranged above a p-doped substrate (and below the buried n-doped semiconductor layer). In this case, the p-doped substrate serves as a pure carrier substrate.

The buried n-doped semiconductor layer is generally a layer deposited by means of an epitaxy method. The method according to the invention can also be applied to lateral power transistors.

The semiconductor body is preferably irradiated through the front side (one of the main surfaces) of the semiconductor body (the surface of the semiconductor body which faces the front side contact of the power transistor).

In one preferred embodiment, the heat treatment of the semiconductor body is effected at temperatures of between 250° C. and 550° C.

The dopant concentration of the region of increased doping may be controlled by the irradiation dose of the proton irradiation. Analogously, the depth of the region of increased doping may be controlled by the irradiation energy of the proton irradiation. The carrier lifetime within the region of increased doping can in turn be controlled by the temperature of the heat treatment process.

The heat treatment process serves, on the one hand, for annealing the crystal defects within the semiconductor body which are produced by the proton irradiation. On the other hand, the extent of the region of increased doping can be controlled during the heat treatment step by way of the temperature of the heat treatment step. If, by way of example, the region of increased doping is produced by irradiating the front side of the semiconductor body, then the region of increased doping can be "extended" in the direction of the front side of the semiconductor body given a sufficiently high heat treatment temperature. If the region of increased doping is to be extended, then the temperature of the heat treatment process may be established for example between 450° C. and 550° C.

The irradiation process of the semiconductor body may be effected in one or more steps. If a multistage irradiation process is chosen, then different irradiation doses and/or irradiation energies can be chosen in each irradiation step, so that a plurality of regions of increased doping or different parts of a region of increased doping are produced with different dopings and/or different depths within the semiconductor body. These regions or parts can then be "merged" with one another using the heat treatment process. It is thus possible to produce inhomogeneous doping concentration profiles of any desired extent within the semiconductor body.

A screen arranged in front of the semiconductor body may be used during the process of irradiating the semiconductor body with protons. On account of the high range of the protons, the screen should be composed of metal. Screens made of resist would have to have a high thickness and are therefore unsuitable. The screen may be configured for example in such a way that a doping of an edge region of the power transistor is at least largely avoided.

In one preferred embodiment, the region of increased doping forms at least one part of a drift path of the power transistor. Corresponding irradiation parameters can be chosen in such a way that the resulting drift path is compensatable insofar as a component of this type is intended to be fabricated.

The region of increased doping may comprise for example 30% of the vertical extent of the drift path, that is to say that 30% of the drift path is formed by the region of increased doping. As an alternative to this, the region of increased doping may comprise at least 50% or at least 70% of the vertical extent of the drift path.

As already mentioned, the method according to the invention can be used in particular for producing a more highly doped region within a compensatable drift path region of a power transistor. Such compensatable drift path regions are distinguished by the fact that the semiconductor body is pervaded by trenches in the region of the drift path region, field electrodes being provided in said trenches. Upon application of a specific potential, the field electrodes bring about a complete charge carrier depletion of the drift path region, whereby it is possible for the drift path region to be doped more highly for the purpose of reducing the forward resistance. The power transistor may be a power MOSFET, by way of example. However, the method according to the invention can also be applied to other semiconductor components, for example CMOS semiconductor components or bipolar semiconductor components.

Further aspects of the invention will be explained in more detail in the description below.

It is an aim of the invention to specify a method which makes it possible to produce a buried n-doped layer (to put it more precisely a region of increased doping in a buried n-doped layer) which has a satisfactory reproducibility and enables a noticeable decrease in the carrier lifetime in the n-doped layer produced. The invention is furthermore intended to enable the production of a doping step.

Such layers are usually produced by means of epitaxy methods, the latter, in particular in conjunction with setting the carrier lifetime, involving a relatively high outlay (from a technical standpoint and also from an economic standpoint).

It is proposed to produce an n-doped zone in a power MOSFET by carrying out a proton irradiation from the front side of the component and subsequently effecting a heat treatment of the component at temperatures of between 250° C. and 550° C. An irradiation with protons leads to the formation of donors, the resulting doping concentration being set by way of the irradiation dose and the depth of the buried n-doped zone being set by way of the irradiation energy.

The donors are formed during a required annealing step at temperatures of between 250° C. and 550° C. from the defects produced by the irradiation itself and also the hydrogen introduced in the process (shallow thermal hydrogen-correlated donors, STD(H), see reference [1]). The doping profiles generated in this way initially follow the primary defect distribution to an approximation, but are influenced by the annealing step.

Besides the donors, a series of further imperfections are produced which act as recombination centers and thus permit a local setting (in the region of the lattice defects produced) of the carrier lifetime. Since the imperfections acting as recombination centers already anneal in the temperature range around 400° C., the carrier lifetime can be influenced by the choice of temperature for the annealing step.

The invention furthermore provides a method for jointly fabricating different components, in which all of the components are formed in a common epitaxial layer, and the doping intensity of specific regions of the epitaxial layer within specific components is increased in a targeted manner by irradiating the epitaxial layer with protons and subsequently carrying out a heat treatment process. In particular, the invention provides a method for jointly fabricating power transistors with a compensation structure and further semiconductor components, in which all of the components are formed in a common epitaxial layer, and the doping intensity of specific regions of the epitaxial layer within the power transistors with a compensation structure is increased as described above.

Instead of a epitaxial layer, it is also possible, of course, to use a semiconductor layer produced in some other way.

BRIEF DESCRIPTION OF THE DRAWINGS

The invention is explained in more detail below in exemplary embodiment with reference to the FIGURES in which.

DETAILED DESCRIPTION

Figure 1:
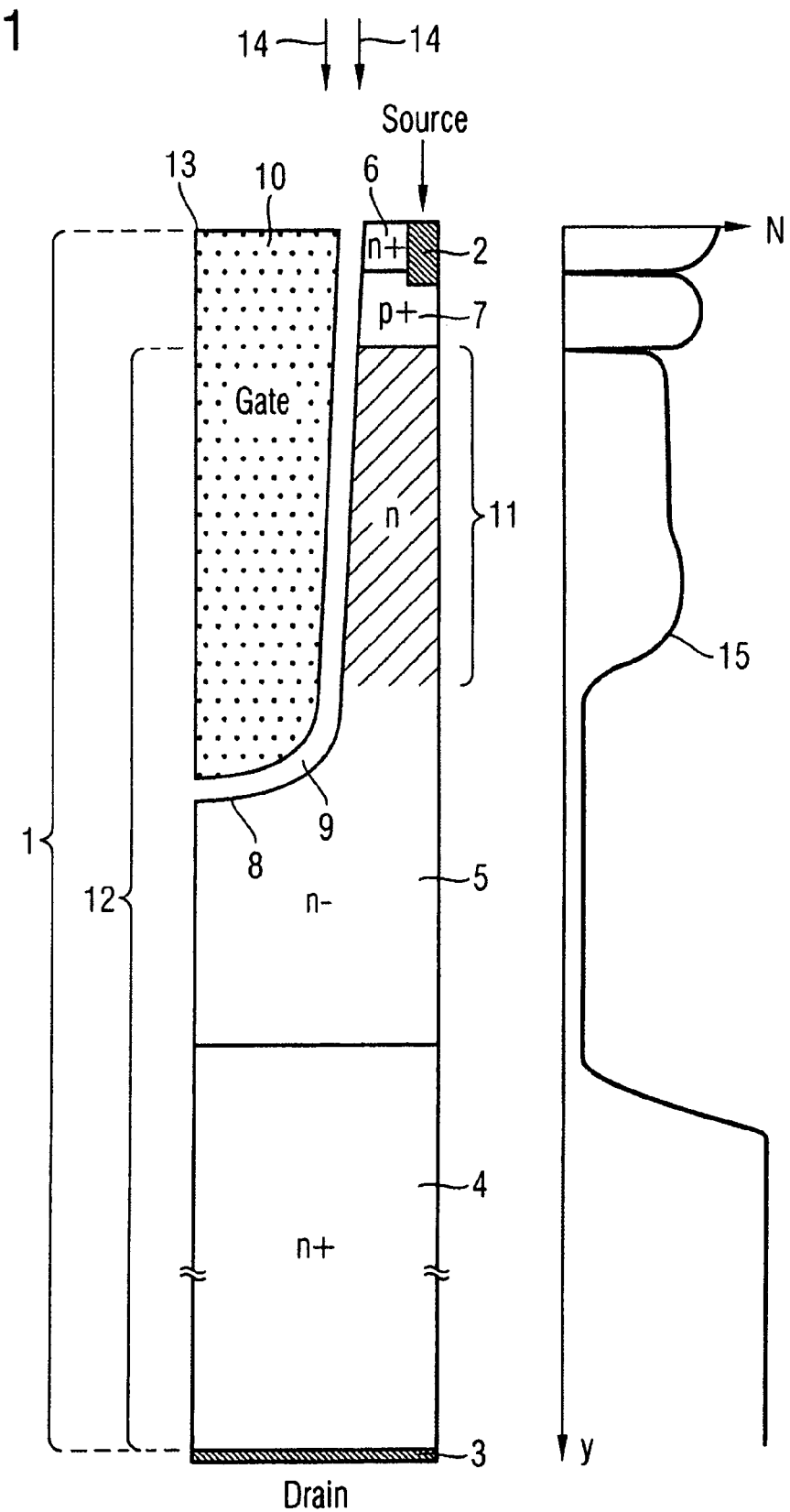
FIG. 1 shows a first embodiment of a semiconductor component which has been fabricated using the method according to the invention.

In the FIGURES, identical or mutually corresponding regions, components or component groups are identified by the same reference numerals.

FIG. 1 shows a cross section through part of a vertical power transistor. The illustration shows a semiconductor body 1, on the front side of which a front side contact 2 is provided and on the rear side of which a rear side contact 3 is provided. The semiconductor body 1 has an $n^+$-doped pedestal semiconductor layer 4, an $n^-$-doped semiconductor layer 5 provided thereon, an $n^+$-doped source region 6 and also a $p^+$-doped body region 7. Furthermore, part of a trench 8 can be seen in the semiconductor body 1, the inner walls of said trench being lined with an insulation layer 9. The insulation layer 9 serves for insulating a gate or field electrode 10 from the semiconductor body 1.

By applying corresponding potentials to the gate/field electrode 10, it is possible to generate electrical flows between the front side contact 2 and the rear side contact 3 through the semiconductor body 1.

The power transistor shown in FIG. 1 furthermore has a varied, n-doped semiconductor layer 11, which forms the upper region of the semiconductor layer 5 and provides for a lower forward resistance in the upper region of the drift region. The buried semiconductor layer 11 is fabricated by irradiating the front side 13 of the power transistor with protons (symbolized by the arrows 14) and a subsequent heat treatment process.

The buried semiconductor layer 11 can thus be fabricated in a simple manner. In conventional fabrication methods the drift region 12 is produced by stacking two differently doped epitaxial layers one on top of the other, which is complicated. The assistance of the method according to the invention, by contrast, makes it possible to reduce the number of epitaxial layers to one.

Furthermore, in the right-hand part of FIG. 1, the doping profile of the semiconductor body 1 (charge carrier concentration N) is plotted against the vertical direction y (reference numeral 15).

Figure 2:
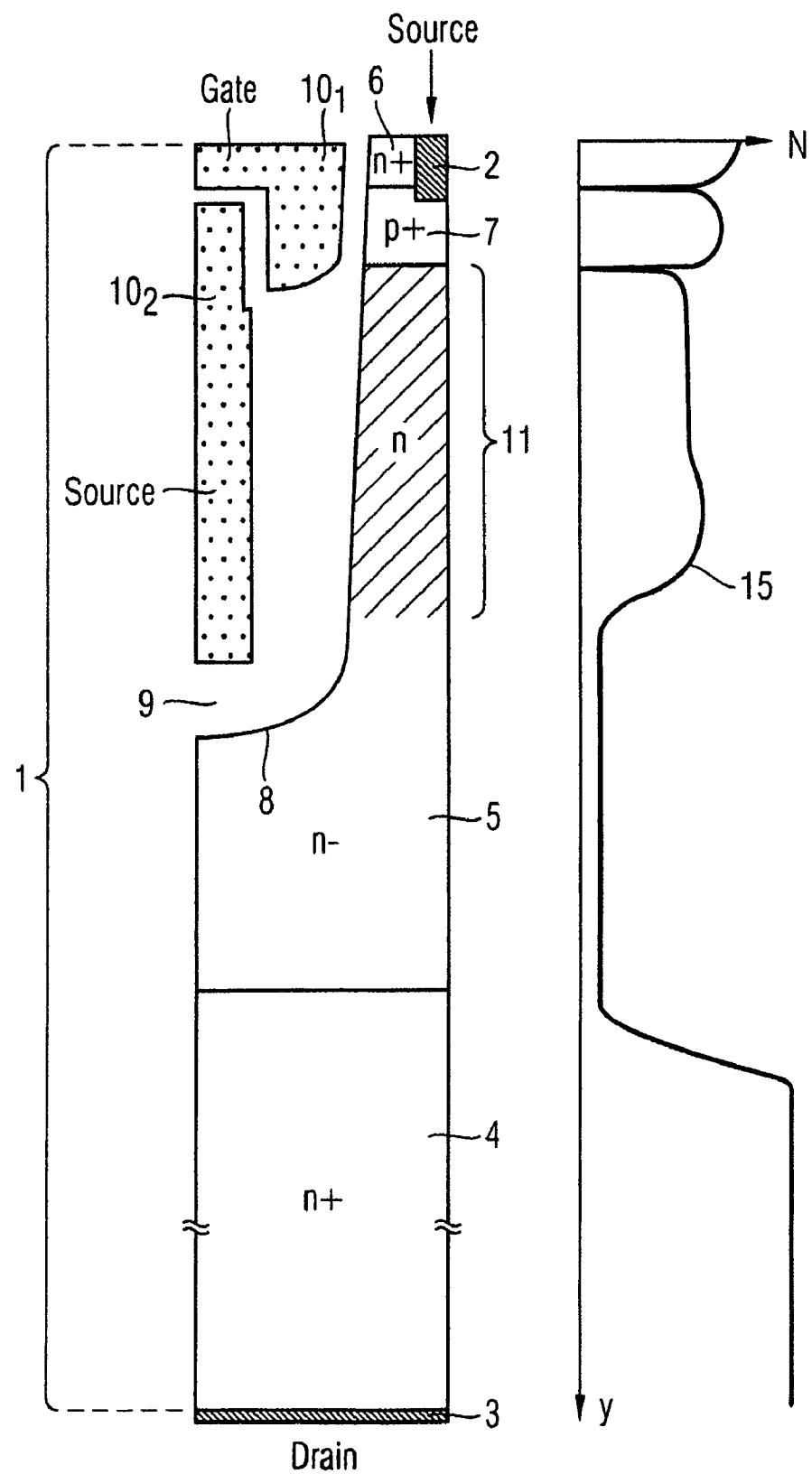
FIG. 2 shows a second embodiment of a semiconductor component which has been fabricated using the method according to the invention.

FIG. 2 shows that the electrode 10 provided in the trench 8 may also be embodied in bipartite fashion, namely in the form of a first (gate) electrode $10_1$ and a second electrode $10_2$, which is at source potential (or some other potential). In the right-hand part of FIG. 2, the doping profile of the semiconductor body 1 (charge carrier concentration N) is plotted against the vertical direction y (reference numeral 15).

Figure 3:
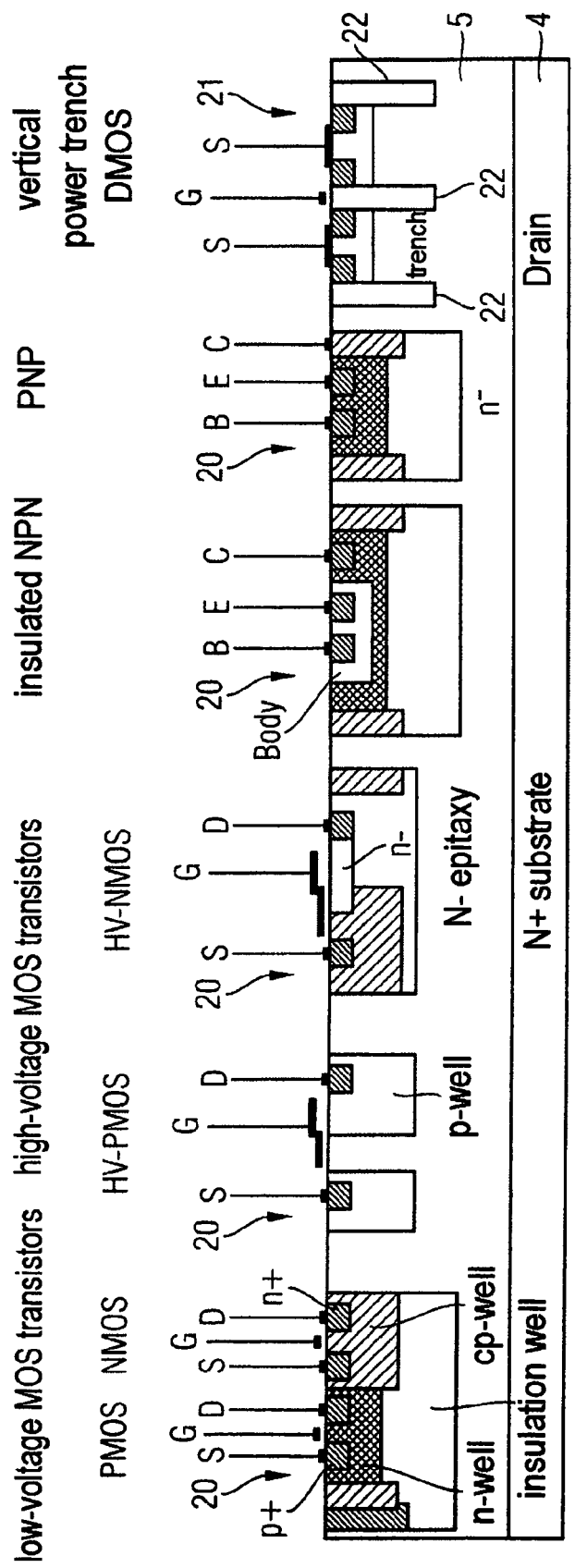
FIG. 3 shows known semiconductor components in a cross-sectional illustration.
Figure 4:
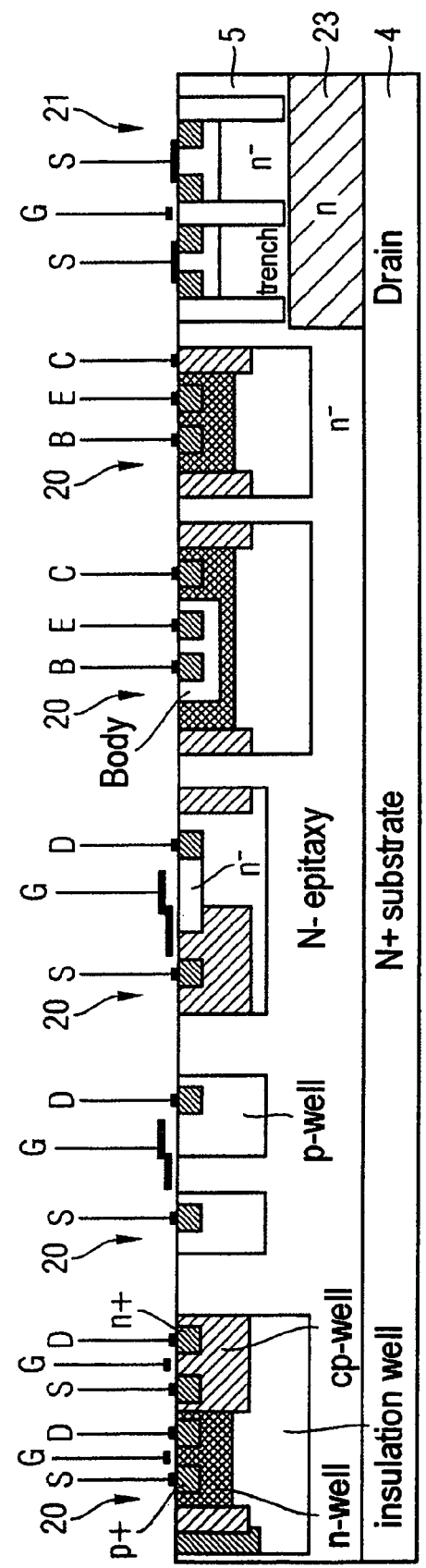
FIG. 4 shows a third embodiment of a semiconductor component which has been fabricated using the method according to the invention.
Figure 5:
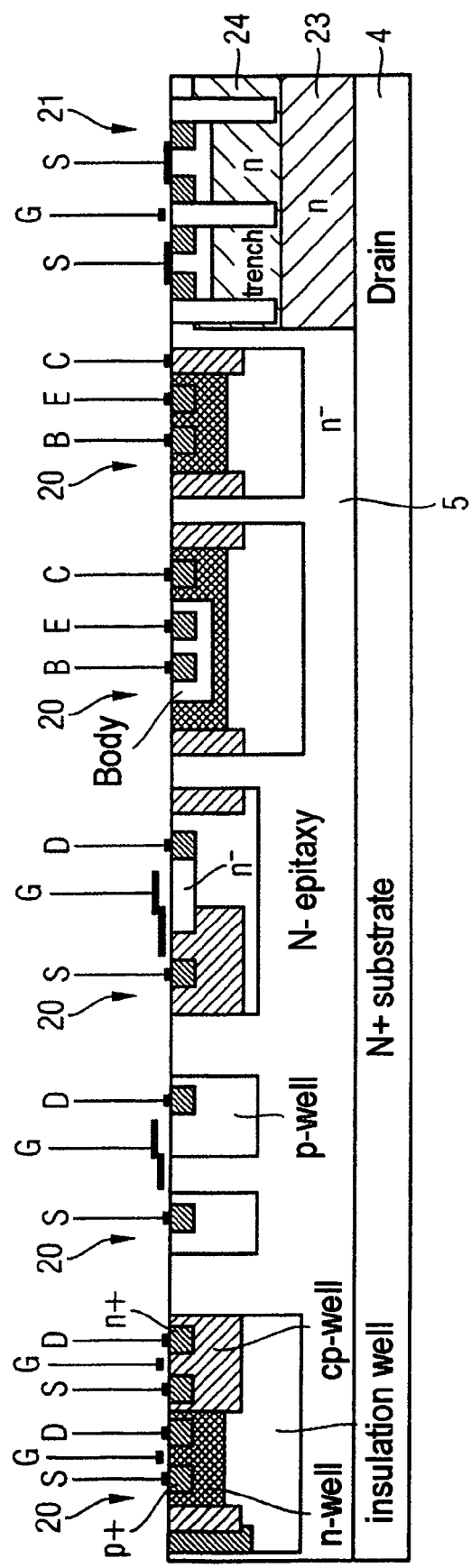
FIG. 5 shows a fourth embodiment of a semiconductor component which has been fabricated using the method according to the invention.

FIGS. 3 to 5 show that the method according to the invention enables the simultaneous fabrication of power transistors with a compensation structure and further components in a common epitaxial layer.

FIG. 3 reveals a plurality of known components and also a known power transistor 21 with a compensation structure (here field electrodes (not shown) in the trenches 22). Source, gate and drain terminals are respectively designated by "S", "G" and "D".

The components 20, 21 are formed in the common epitaxial layer 5 situated above the substrate 4. For the transistors 20, the substrate 4 serves merely as a carrier substrate; for the power transistor 21, the substrate 4 serves as drain terminal region. The thickness of the epitaxial layer 5 and also its doping (weakly n-doped) are specifically adapted to the requirements of the transistors 20, that is to say that the doping intensity of the epitaxial layer 5 is too weak and its thickness too large for the power transistor 21. This can be compensated for by the method according to the invention by a procedure in which, as is shown in FIGS. 4 and 5, the epitaxial layer 5 is irradiated with protons and subsequently subjected to heat treatment. This raises the doping intensity in defined regions of the epitaxial layer 5 (regions 23, 24). The forward resistance is reduced by the regions 23, 24. During the irradiation, a mask is expediently used in order to prevent the doping intensity from being raised within the transistors 20. The region 24 is advantageously configured in such a way that the charges present therein can be depleted by the compensation structure in the off-state case. This does not apply to the region 23.

Further aspects of the invention will be explained in the description below.

A typical example of a structure that can be produced by the method according to the invention is illustrated in FIG. 2. The power-MOSFET with a vertical structure illustrated here has a special compensation structure (as described in [2]) within the trench region. Said compensation structure enables a much higher doping within this region and thus significantly reduced on-state losses with a high blocking capability than in the case of conventional structures.

FIG. 1 shows a further structure that can be produced by the method according to the invention (conventional structure with a trench gate).

The high blocking ability of the structures shown in FIGS. 1 and 2 also results from the lightly doped n⁻-type layer arranged directly below the trench structure. The depth of the n-doped buried layer produced by the proton irradiation is in the range of approximately 1 µm to approximately 5 µm in the examples shown in FIG. 1 and FIG. 2. Since, on the one hand, the vertical extent of the n-doped layer is predetermined by the irradiation energy, and, on the other hand, under certain circumstances, a larger extent of the n-doped layer in the vertical direction is desired and would initially be established on account of the irradiation (as in the case of the example shown), three possibilities are taken into consideration for widening the n-doped layer.

One possibility is to effect irradiation with a plurality of implantation energies, but this is relatively complicated. Another possibility is to effect irradiation through a screen of defined thickness, in which case a higher implantation energy would be required, as a result of which—as desired—the vertical distribution of the donors produced could be widened in a targeted manner. The simplest possibility is to choose a temperature of between 450° C. and 550° C. in the heat treatment. However, the widening of the n-doped layer takes place only in the direction of front side of the component (component surface) since a combination of the hydrogen atoms radiated in and the irradiation-dictated defects is required to form the proton-induced donors.

Since the donors produced by the proton irradiation anneal at temperatures of above 550° C., the process described above should as far as possible be carried out at the end of the overall fabrication process for the component. The temperature is to be chosen such that a metallization or polyimide layer that has possibly already been applied is not damaged by the thermal loading.

Since the threshold voltage can easily decrease when an irradiation is carried out, it is recommended to increase the p-type doping in the body zone as required in such a way as to result in the same threshold voltage as with a non-irradiated semiconductor component. This entails the advantage that the transistor gain factor $\alpha_{npn}$ is correspondingly reduced and the avalanche robustness thus rises.

The method according to the invention has the advantage for power-MOSFETs of higher voltage ranges (100...400 V) that with the aid of suitable masking in the edge structure required for ensuring the blocking capability, it is possible to avoid an increase in the doping in the masked region—this is not possible in the case of the customary epitaxially deposited layers. As a result, the edge structure is simplified considerably since it can be introduced into the lightly doped layer with a correspondingly higher blocking capability.

In other words: a main problem when a structure optimized for a low voltage is utilized for higher voltages (if a more lightly doped layer is arranged under the structure optimized for the low voltage) is the edge determination. The latter lies at the surface of the component and can only take up the blocking capability of the surface doping. An undesirable increase in the doping within the edge region (and thus a reduction of the blocking effect of the edge region) can therefore be avoided by using a mask.

Accordingly, by means of a proton irradiation from the front side of the wafer, the invention provides a relatively simple process for fabricating a buried n-doped layer, which may also serve for producing a stepped doping profile, in power-MOSFETs.

The method can be applied to all power transistors whose compensated drift path is intended to be doped more highly than an underlying, non-compensated pedestal epitaxial layer if both drift path and pedestal epitaxial layer are intended to take up voltage. The drift path doping can be compensated for by field plates (field electrodes) in a trench. In this case, the field plates may be at source potential, gate potential or some other suitable potential. The field plates may be connected to gate electrodes or in each case be subdivided into a plurality of field plates which lie one above another and are at different potentials. Likewise, it is possible to use a semi-insulating layer through which current flows, or the compensation may be effected either by floating or by depletable, non-floating p-type regions. Finally, the trenches may be filled with a dielectric having a high dielectric constant compared with silicon, into which dielectric electrodes may be embedded.

The method can also be used in technologies in which compensated power switches are produced together with CMOS, bipolar and other components monolithically in a common semiconductor body (FIG. 3).

In this case, CMOS or bipolar components which have the same breakdown voltage as that of the compensated power switch are often intended to be produced together with the compensated power switch in a common fabrication process (in a common epitaxial layer). Since the breakdown voltage of the power switch is raised by the compensation device a more lightly doped drift path having a larger thickness is required for the other components. Since the power switch is realized in the same epitaxial layer, its forward resistance is greatly increased in comparison with an epitaxial layer optimized for the power switch.

In this case, the method according to the invention makes it possible, by means of a plurality of implantations in the region of the additional lower thickness of the epitaxial layer that is required by the other components, to introduce a maximum dopant concentration for lowering the forward resistance. The implantation is masked in the region of the non-compensating components having a high blocking capability. In the upper region of the epitaxial layer, the doping can likewise be increased by means of the same mask in order thus to set an optimum dopant concentration for the compensated power switch. The two implantations can be carried out jointly or else individually.

In other words: if different components are realized in the same epitaxial layer, the doping of the epitaxial layer is identical throughout and depends on the required blocking capability. The thickness of the epitaxial layer is thus defined, although this could turn out to be smaller for the compensation component on account of the compensation structure. In order to compensate for the unnecessarily high forward resistance resulting therefrom, and since the vertical extent of the epitaxial layer is too large to introduce a doping step by means of normal implantation (an implantation of generally customary dopants such as boron, phosphorus, arsenic or antimony), the use of the method according to the invention is appropriate here as well. Since the hydrogen nuclei are significantly lighter than customary dopants, buried n-doped regions can be realized to greater depths. A masking for avoiding this increased doping is then necessary in the region of those components which require a low basic doping in order to realize the required blocking capability. With the aid of the proton implantation, it is subsequently possible not only to produce a doping step near the surface, but also, depending on the component, a buried doping in a depth defined by the irradiation energy (it is also possible to combine a plurality of irradiations with one another).

The semiconductor component may have an n+-substrate with a rear side drain contact or a p-type substrate, the current being passed via a "buried layer" (buried semiconductor layer) below the epitaxial layer in the case of vertical components.

Further aspects of the invention are explained in the description below.

FIG. 2 shows that according to the invention, in a field plate trench MOS transistor having a field oxide that is thickened in comparison with the gate oxide, the epitaxial layer is "replaced" by a region of higher n-type doping produced by means of proton irradiation.

The background is that in such a field plate trench MOS transistor, in the region of the field plate (that is the source contact in the region of the trench in FIG. 2), a higher doping than in a normal trench MOS is possible on account of the compensation effect of the field plate. A further aspect is that there is already a finished optimized component for a lower reverse voltage. The method according to the invention makes it possible to use this component in the region of higher reverse voltages as well with a comparatively low outlay: it is not necessary to readapt the complete structure at the surface (trench, etc.), which would be complicated, rather it suffices to "interpose" an epitaxial layer having lower doping according to the required blocking capability (the epitaxial layer having lower doping, also referred to as buried n-doped semiconductor layer).

The field plate (that part of the source which is situated in the trench in FIG. 2) may be at source potential, but may in principle also be connected to other potentials (e.g. gate potential). The field plate may also be merged with the gate, as shown in FIG. 1, but this would entail a large gate capacitance; therefore, an oxide layer with a gradated course is preferable. Furthermore, it is possible, e.g. when shrinking the field plate trench transistor, for a plurality of field plates connected to different potentials also to be used instead of one field plate. A semi-insulating layer through which current flows may also be used.

The method according to the invention uses an annealing step to anneal undesirable defect centers/complexes and to stabilize the center composition. If the component is e.g. soldered again after the irradiation (when the chip is incorporated into a housing or a module), then it is no longer permitted for anything to change on the component. Some centers (the term centers is also used to mean the complexes which ultimately effect the doping) also form in the first place according to the temperature of the annealing step. Over and above this, at higher temperatures the doping centers increasingly also form in the region of the irradiated semiconductor, which may be desirable or undesirable depending on the application.

Some of the centers formed reduce the charge carrier lifetime —this, too, may be desirable or undesirable. These centers anneal at temperatures of up to approximately 350° C.-400° C.

The annealing temperature lies between 250° C. and 550° C. depending on the application.

Literature

[1] H.-J. Schulze, F.-J. Niedernostheide, M. Schmitt, U. Kellner-Werdehausen, G. Wachutka, Electrochemical Society Proceedings volume 2002-20, High Purity VII, ed. by C. L. Claeys, M. Watanabe, P. Rai-Choudhury, and P. Stallhofer, pp. 320-335

[2] V. A. K. Temple, U.S. Pat. No. 4,941,026, 1990

The invention claimed is:

1. A method for producing a power transistor in a semiconductor body, the power transistor including an n-doped substrate, an n-doped semiconductor layer provided on the n-doped substrate, and a p-doped region provided within the upper region of the n-doped semiconductor layer, the method comprising:
   a) irradiating at least a part of a front side of the semiconductor body with protons, and
   b) heat treating the semiconductor body at a temperature of approximately between 450 C and 550 C, wherein by the heat treatment a region of increased n-doping is formed in the n-doped semiconductor layer between the n-doped substrate and the p-doped region, which contains proton-induced donors and which includes an essentially homogenous doping profile due to a combination of the irradiated protons with defects caused by irradiation, wherein the homogenous doping profile extends from a doping maximum and in the direction of the front side of the semiconductor body, wherein the region of increased n-doping in the upper region of the n-doped semiconductor layer is immediately adjacent to the p-doped body region.

2. The method according to claim 1, wherein the n-doped semiconductor layer is generally a layer deposited by means of an epitaxial method.

3. The method as claimed in claim 1, wherein the irradiating further comprises irradiating the at least one part of a surface, such that the surface comprises a surface of the semiconductor body which is closes to a source contact of the semiconductor body.

4. The method as claimed in claim 1, further comprising using the region of increased n-doping as at least one part of a drift path of the power transistor.

5. The method as claimed in claim 4, wherein the irradiating further comprises selecting irradiation parameters such that the resulting drift path is compensatable.

6. The method as claimed in claim 5, wherein the region of increased n-doping comprises at least 30% of a vertical extent of the drift path.

7. The method as claimed in claim 6, wherein the region of increased n-doping comprises at least 50% or 70% of the vertical extent of the drift path.

8. The method as claimed in claim 1, further comprising, after the irradiating step, performing at least one additional proton irradiation with at least one different irradiation parameter prior to the heat-treating step.

9. The method as claimed in claim 8, wherein performing at least one additional proton irradiation further comprises performing the at least one different proton irradiation on at least a first part of the region of increased n-doping differs from a second part of the region with increased doped irradiated in the irradiation step.

10. The method as claimed in claim 1, wherein the irradiation step further comprises irradiating at least one part of a surface of the semiconductor body through a screen of defined thickness arranged in front of the semiconductor body.

11. The method as claimed in claim 10, wherein the screen is configured in such a way that a doping of an edge region of the power transistor is substantially avoided.

12. The method as claimed in claim 1, wherein the power transistor is a power MOSFET.

13. A process for jointly fabricating power transistors with a compensation structure and further semiconductor components without compensation structure in a common n-doped semiconductor layer wherein the regions with increased n-doping, of the n-doped semiconductor layer within the power transistor with compensation structure is produced according to the method of claim 1.

* * * * *